(12) United States Patent
Kita et al.

(10) Patent No.: US 9,541,951 B2
(45) Date of Patent: Jan. 10, 2017

(54) DISPLAY AND TELEVISION SET

(71) Applicant: Funai Electric Co., Ltd., Daito-shi (JP)

(72) Inventors: Yuki Kita, Daito (JP); Akihiro Fujikawa, Daito (JP)

(73) Assignee: Funai Electric Co., Ltd., Daito-shi (JP)

( * ) Notice: Subject to any disclaimer, the term of this patent is extended or adjusted under 35 U.S.C. 154(b) by 551 days.

(21) Appl. No.: 13/660,649

(22) Filed: Oct. 25, 2012

(65) Prior Publication Data

US 2013/0107140 A1 May 2, 2013

(30) Foreign Application Priority Data

Oct. 26, 2011 (JP) ................................. 2011-234552

(51) Int. Cl.
| | |
|---|---|
| H04N 5/64 | (2006.01) |
| G06F 1/16 | (2006.01) |
| H04N 5/645 | (2006.01) |
| H04N 5/655 | (2006.01) |
| H04N 5/65 | (2006.01) |
| H05K 5/02 | (2006.01) |
| G02F 1/1333 | (2006.01) |

(52) U.S. Cl.
CPC ....... *G06F 1/1601* (2013.01); *G02F 1/133308* (2013.01); *H04N 5/64* (2013.01); *H04N 5/645* (2013.01); *H04N 5/65* (2013.01); *H04N 5/655* (2013.01); *H05K 5/02* (2013.01); *G02F 2001/13332* (2013.01); *G02F 2001/133314* (2013.01)

(58) Field of Classification Search
CPC ............ H04N 5/64; H04N 5/645; H04N 5/65; H04N 5/655
USPC .. 348/836, 818; 248/415, 419, 425; 361/687
See application file for complete search history.

(56) References Cited

U.S. PATENT DOCUMENTS

| | | | |
|---|---|---|---|
| 2006/0044489 A1 | 3/2006 | Uchizono | |
| 2006/0120034 A1* | 6/2006 | Huang | ........................... 361/687 |
| 2007/0252487 A1* | 11/2007 | Fujii | ...................... H02K 1/146 |
| | | | 310/68 B |
| 2008/0030830 A1* | 2/2008 | Yamaguchi et al. | .......... 359/245 |
| 2008/0099652 A1* | 5/2008 | Sawai et al. | ................... 248/419 |
| 2010/0060625 A1* | 3/2010 | Hashimoto | .......... G09G 3/2927 |
| | | | 345/213 |
| 2010/0150390 A1* | 6/2010 | Nishiyama | ............. H04R 1/028 |
| | | | 381/388 |
| 2010/0253874 A1 | 10/2010 | Ito et al. | |
| 2013/0027648 A1* | 1/2013 | Moriwaki | ..................... 349/138 |

FOREIGN PATENT DOCUMENTS

| | | |
|---|---|---|
| JP | 2001-33764 A | 2/2001 |
| JP | 2001-265239 A | 9/2001 |
| JP | 2006-67380 A | 3/2006 |
| JP | 2009-134269 A | 6/2009 |
| JP | 2010-8815 A | 1/2010 |
| WO | WO 2011129065 A1 * | 10/2011 |

* cited by examiner

*Primary Examiner* — Sath V Perungavoor
*Assistant Examiner* — Xiaolan Xu
(74) *Attorney, Agent, or Firm* — Crowell & Moring LLP

(57) ABSTRACT

This display includes a display panel support member having a rear surface partially constituting a rear housing and a cover member mounted on the display panel support member to partially cover the rear surface thereof. A movement regulating portion regulating movement of the cover member is provided on the rear surface of the display support member.

17 Claims, 9 Drawing Sheets

300-300

DISPLAY AND TELEVISION SET

BACKGROUND OF THE INVENTION

Field of the Invention

The present invention relates to a display and a television set, and more particularly, it relates to a display and a television set each including a display panel support member supporting a display panel.

Description of the Background Art

A display including a display panel support member supporting a display panel is known in general, as disclosed in Japanese Patent Laying-Open No. 2009-134269, for example.

The aforementioned Japanese Patent Laying-Open No. 2009-134269 discloses a display including a front cabinet, a rear cabinet (display panel support member) and a liquid crystal display panel (display panel). In this display, the liquid crystal display panel is arranged between the front cabinet and the rear cabinet, while a circuit board is arranged at the back of the liquid crystal display panel. A rear surface (back surface) of the rear cabinet has a planar shape, and the circuit board is covered with the planar surface portion of the rear cabinet.

In a case where a cover member is further mounted on the rear surface of the rear cabinet, for example, in the display described in the aforementioned Japanese Patent Laying-Open No. 2009-134269, however, it is conceivably difficult to arrange and mount the cover member on a prescribed position of the rear cabinet, due to the flat rear surface of the rear cabinet. Therefore, mounting workability is conceivably deteriorated when the cover member is mounted on the rear cabinet (display panel support member).

SUMMARY OF THE INVENTION

The present invention has been proposed in order to solve the aforementioned problem, and an object of the present invention is to provide a display and a television set each capable of improving mounting workability when mounting a cover member on a display panel support member.

A display according to a first aspect of the present invention includes a display panel support member arranged at the back of a display panel to support the display panel so that part of a rear surface constitutes a rear housing and a cover member mounted on the display panel support member to cover the part of the rear surface of the display panel support member constituting the rear housing, while a movement regulating portion regulating movement of the cover member is provided on the rear surface of the display panel support member.

In the display according to the first aspect, as hereinabove described, the movement regulating portion regulating movement of the cover member is provided on the rear surface of the display panel support member so that the same regulates movement of the cover member, whereby the cover member can be roughly positioned and station-kept when mounted on the display panel support member. Thus, mounting workability can be improved when mounting the cover member on the display panel support member. Further, the movement regulating portion regulating movement of the cover member is so provided on the display panel support member that the same can reliably regulate inward or outward movement of an outer peripheral edge portion of the cover member when external force is applied to the cover member in a state where the cover member is fixed to the display panel support member.

In the aforementioned display according to the first aspect, the movement regulating portion provided on the display panel support member preferably includes a first movement regulating portion consisting of a recess portion concaved toward the display panel, and the display is preferably so formed that an inner side surface of the recess portion of the display panel support member regulates outward movement of the cover member. According to this structure, the cover member can be easily positioned and station-kept outward by the inner side surface of the recess portion, whereby the mounting workability for the cover member can be easily improved. Further, the inner side surface of the recess portion so regulates movement of the cover member that dust can be inhibited from penetrating into the display panel support member through a hole portion or an upright portion or light emitted from a backlight can be inhibited from leaking out of the hole portion or the upright portion, dissimilarly to a case of regulating movement of the cover member (holding the cover member) by forming the hole portion or the upright portion on the rear surface of the display panel support member.

In this case, the recess portion provided on the display panel support member is preferably provided from an inner region up to a lower region of the display panel support member as viewed from behind, the inner side surface of the recess portion provided on the display panel support member preferably extends to have an inverted U shape as viewed from behind, and a region where an outer side surface of the cover member and the inner side surface of the recess portion of the display panel support member are opposed to each other preferably extends to have an inverted U shape as viewed from behind. According to this structure, the cover member can be easily roughly positioned and station-kept with respect to three directions by three inner side surfaces (three sides) of the recess portion having the inverted U shape, whereby the mounting workability for the cover member can be further improved.

In the aforementioned display according to the first aspect, the movement regulating portion provided on the display panel support member preferably includes a second movement regulating portion consisting of a projecting portion protruding rearward from the rear surface of the display panel display portion, and the display is preferably so formed that an outer side surface of the projecting portion of the display panel support member regulates inward movement of the cover member. According to this structure, the cover member can be easily roughly positioned and station-kept inward by the outer side surface of the projecting portion, whereby the mounting workability can be improved also by this when mounting the cover member on the display panel support member.

In this case, the movement regulating portion provided on the display panel support member preferably includes a first movement regulating portion consisting of a recess portion concaved toward the display panel, the second movement regulating portion consisting of the projecting portion is preferably provided inward beyond the first movement regulating portion consisting of the recess portion as viewed from behind, and an outer edge portion of the cover member is preferably arranged between the outer side surface of the projecting portion and an inner side surface of the recess portion. According to this structure, the cover member can be roughly positioned and station-kept outward and inward by the first movement regulating portion consisting of the recess portion and the second movement regulating portion consisting of the projecting portion respectively, whereby the mounting workability can be further improved when mounting the cover member on the display panel support member.

In the aforementioned display including the cover member having the outer edge portion arranged between the outer side surface of the projecting portion and the inner side surface of the recess portion, a region of the display panel support member provided with the recess portion preferably has a rectangular shape, and the second movement regulating portion consisting of the projecting portion is preferably formed in the vicinity of one side constituting an outer peripheral portion of the rectangular region of the display panel support member provided with the recess portion, to extend along this side. According to this structure, the cover member can be effectively roughly positioned and station-kept inward by the outer side surface of the second movement regulating portion (projecting portion) extending along one side.

In the aforementioned display including the cover member having the outer edge portion arranged between the outer side surface of the projecting portion and the inner side surface of the recess portion, the cover member preferably includes a first rib portion arranged to be opposed to the projecting portion of the display panel support member and integrally formed on the cover member, and the display is preferably so formed that the first rib portion of the cover member opposed to the projecting portion of the display support member regulates inward movement of the cover member. According to this structure, the mounting workability for the cover member can be improved by roughly positioning and station-keeping the cover member inward with the first rib portion of the cover member while suppressing increase in number of components, dissimilarly to a case where the first rib portion is provided separately from the cover member.

In this case, a region of the display panel support member provided with the first movement regulating portion consisting of the recess portion preferably has a rectangular shape, the second movement regulating portion consisting of the projecting portion is preferably formed in the vicinity of one side constituting an outer peripheral portion of the rectangular region of the display panel support member provided with the first movement regulating portion consisting of the recess portion to extend along this side, and a plurality of first rib portions are preferably formed at an interval along the extensional direction of the second movement regulating portion. According to this structure, the cover member can be effectively roughly positioned and station-kept inward by the plurality of first rib portions formed at the interval along the extensional direction of the second movement regulating portion, whereby the mounting workability for the cover member can be further improved.

In the aforementioned display according to the first aspect, the movement regulating portion provided on the display panel support member preferably includes a third movement regulating portion consisting of an upright portion formed by partially uprighting the rear surface of the display panel support member, and the display is preferably so formed that the upright portion of the display panel support member regulates inward movement of the cover member. According to this structure, the cover member can be easily roughly positioned and station-kept inward by the upright portion of the display panel support member.

In this case, the upright portion on the rear surface of the display panel support member is preferably formed by uprighting a portion corresponding to a hole portion for passing a wire therethrough when the hole portion is formed.

According to this structure, manufacturing steps for the display can be simplified, dissimilarly to a case of forming the upright portion and the hole portion for passing the wire therethrough separately from each other.

In the aforementioned display including the third movement regulating portion consisting of the upright portion, the movement regulating portion provided on the display panel support member preferably includes a first movement regulating portion consisting of a recess portion concaved toward the display panel, the third movement regulating portion consisting of the upright portion is preferably formed by uprighting a portion of the rear surface of the display panel support member inward beyond the first movement regulating portion consisting of the recess portion toward the side of the cover member as viewed from behind, and an outer edge portion of the cover member is preferably arranged between an uprighted end portion of the upright portion closer to the cover member and an inner side surface of the recess portion. According to this structure, the cover member can be roughly positioned and station-kept outward and inward by the first movement regulating portion consisting of the recess portion and the third movement regulating portion consisting of the upright portion respectively, whereby the mounting workability can be further improved when mounting the cover member on the display panel support member.

In this case, the movement regulating portion provided on the display panel support member preferably includes a second movement regulating portion consisting of a projecting portion protruding rearward from the rear surface of the display panel display portion, a region of the display panel support member provided with the recess portion preferably has a rectangular shape, and the second movement regulating portion consisting of the projecting portion and the third movement regulating portion consisting of the upright portion are preferably formed along two sides constituting an outer peripheral portion of the rectangular region of the display panel support member provided with the recess portion and intersecting with each other. According to this structure, the cover member can be more effectively roughly positioned and station-kept inward by the projecting portion (second movement regulating portion) and the upright portion (third movement regulating portion) formed along the two sides intersecting with each other respectively.

The aforementioned display portion having the second and third movement regulating portions, consisting of the projecting portion and the upright portion, formed along the two sides intersecting with each other is preferably provided with a plurality of third movement regulating portions consisting of the upright portions. According to this structure, the cover member can be further effectively roughly positioned and station-kept inward by the plurality of third movement regulating portions.

In the aforementioned display including the third movement regulating portion consisting of the upright portion, the cover member preferably includes a second rib portion arranged to be opposed to the upright portion of the display panel support member and integrally formed on the cover member, and the display is preferably so formed that the second rib portion of the cover member opposed to the upright portion of the display panel support member regulates inward movement of the cover member. According to this structure, the cover member can be roughly positioned and station-kept inward by the second rib portion of the cover member while suppressing increase in number of components, dissimilarly to a case where the second rib portion is provided separately from the cover member.

In the aforementioned display according to the first aspect, the display panel support member is preferably made of metal, and the cover member is preferably made of resin. According to this structure, the mounting workability can be improved when mounting the cover member made of resin on the display panel support member made of metal.

A television according to a second aspect of the present invention includes a receiving portion capable of receiving television broadcasting, a display panel support member arranged at the back of a display panel to support the display panel so that part of a rear surface constitutes a rear housing and a cover member mounted on the display panel support member to cover the part of the rear surface of the display panel support member constituting the rear housing, while a movement regulating portion regulating movement of the cover member is provided on the rear surface of the display panel support member.

In the television set according to the second aspect, as hereinabove described, the movement regulating portion regulating movement of the cover member is provided on the rear surface of the display panel support member so that the same regulates movement of the cover member, whereby the cover member can be roughly positioned and station-kept when mounted on the display panel support member. Thus, a television set capable of improving mounting workability when mounting the cover member on the display panel support member can be provided. Further, the movement regulating portion regulating movement of the cover member is so provided on the display panel support member that a television set capable of reliably regulating inward or outward movement of an outer peripheral edge portion of the cover member with the movement regulating member when external force is applied to the cover member in a state where the cover member is fixed to the display panel support member can be provided.

In the aforementioned television set according to the second aspect, the movement regulating portion provided on the display panel support member preferably includes a first movement regulating portion consisting of a recess portion concaved toward the display panel, and the television set is preferably so formed that an inner side surface of the recess portion of the display panel support member regulates outward movement of the cover member. According to this structure, the inner side surface of the recess portion can easily position and station-keep the cover member outward, whereby mounting workability for the cover member can be easily improved. Further, the inner side surface of the recess portion so regulates movement of the cover member that dust can be inhibited from penetrating into the display panel support member through a hole portion or an upright portion or light emitted from a backlight can be inhibited from leaking out of the hole portion or the upright portion, dissimilarly to a case of regulating movement of the cover member (holding the cover member) by forming the hole portion or the upright portion on the rear surface of the display panel support member.

In this case, the recess portion provided on the display panel support member is preferably provided from an inner region up to a lower region of the display panel support member as viewed from behind, the inner side surface of the recess portion provided on the display panel support member preferably extends to have an inverted U shape as viewed from behind, and a region where an outer side surface of the cover member and the inner side surface of the recess portion of the display panel support member are opposed to each other preferably extends to have an inverted U shape as viewed from behind. According to this structure, the cover member can be easily roughly positioned and station-kept with respect to three directions by three inner side surfaces (three sides) of the recess portion having the inverted U shape, whereby the mounting workability for the cover member can be further improved.

In the aforementioned television set according to the second aspect, the movement regulating portion provided on the display panel support member preferably includes a second movement regulating portion consisting of a projecting portion protruding rearward from the rear surface of the display panel display portion, and the television set is preferably so formed that an outer side surface of the projecting portion of the display panel support member regulates inward movement of the cover member. According to this structure, the cover member can be easily roughly positioned and station-kept inward by the outer side surface of the projecting portion, whereby the mounting workability can be improved also by this when mounting the cover member on the display panel support member.

In this case, the movement regulating portion provided on the display panel support member preferably includes a first movement regulating portion consisting of a recess portion concaved toward the display panel, the second movement regulating portion consisting of the projecting portion is preferably provided inward beyond the first movement regulating portion consisting of the recess portion as viewed from behind, and an outer edge portion of the cover member is preferably arranged between the outer side surface of the projecting portion and an inner side surface of the recess portion. According to this structure, the cover member can be roughly positioned and station-kept outward and inward by the first movement regulating portion consisting of the recess portion and the second movement regulating portion consisting of the projecting portion respectively, whereby the mounting workability can be further improved when mounting the cover member on the display panel support member.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

The structure of a liquid crystal television set 100 according to the embodiment of the present invention is described with reference to FIGS. 1 to 10. The liquid crystal television set 100 is an example of the "display" or the "television set" in the present invention.

Figure 1:
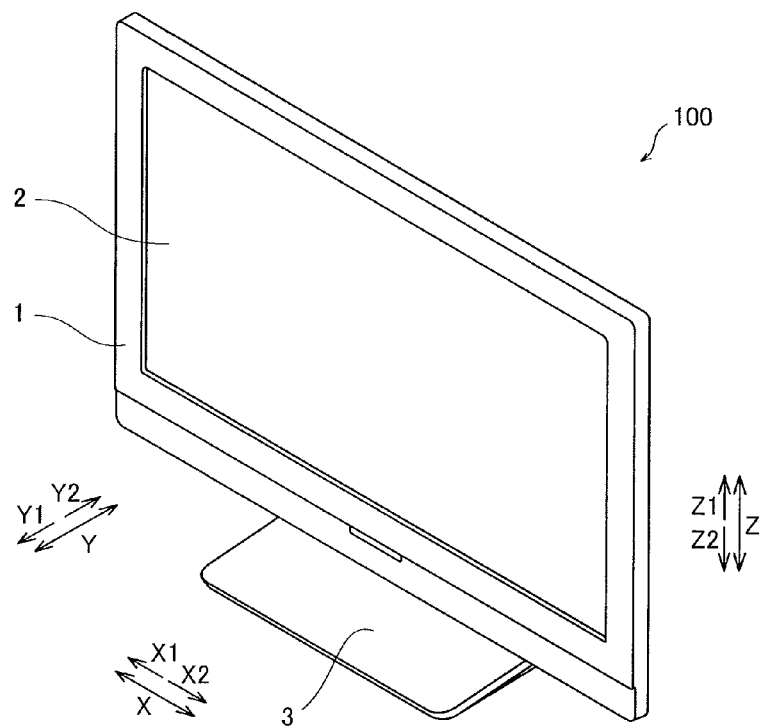
FIG. 1 is an overall perspective view of a liquid crystal television set according to an embodiment of the present invention as viewed from front.
Figure 2:
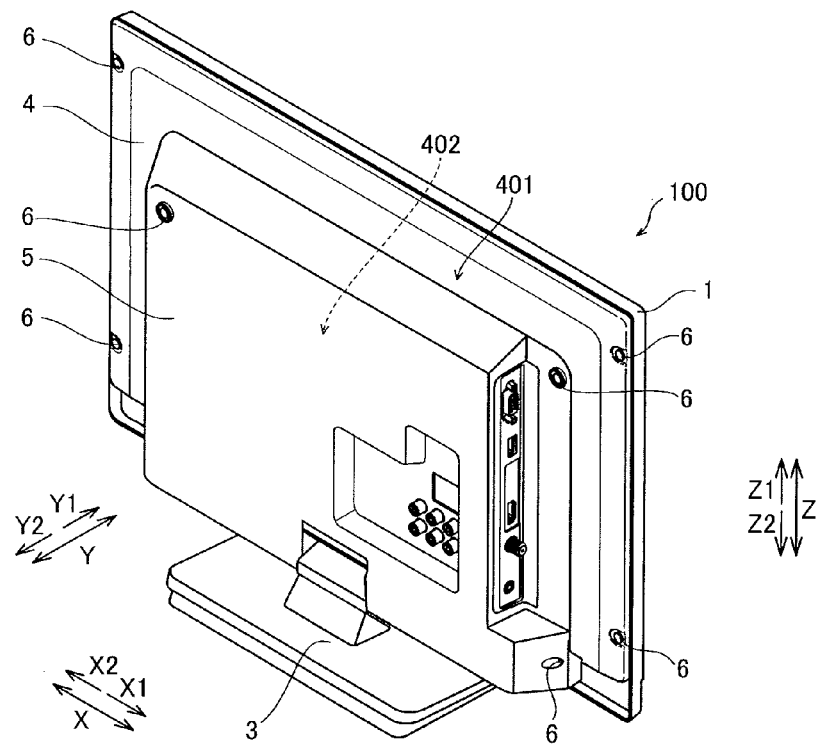
FIG. 2 is an overall perspective view of the liquid crystal television set according to the embodiment of the present invention as viewed from behind.

The liquid crystal television set 100 according to the embodiment of the present invention has a rectangular shape, and includes a frame-shaped front housing 1, a liquid crystal display panel 2 stored in the front housing 1 and a stand member 3 supporting the overall liquid crystal television set 100, as shown in FIGS. 1 and 2. The liquid crystal display panel 2 is an example of the "display panel" in the present invention. Both of the front housing 1 and the stand member 3 are made of resin.

Figure 4:
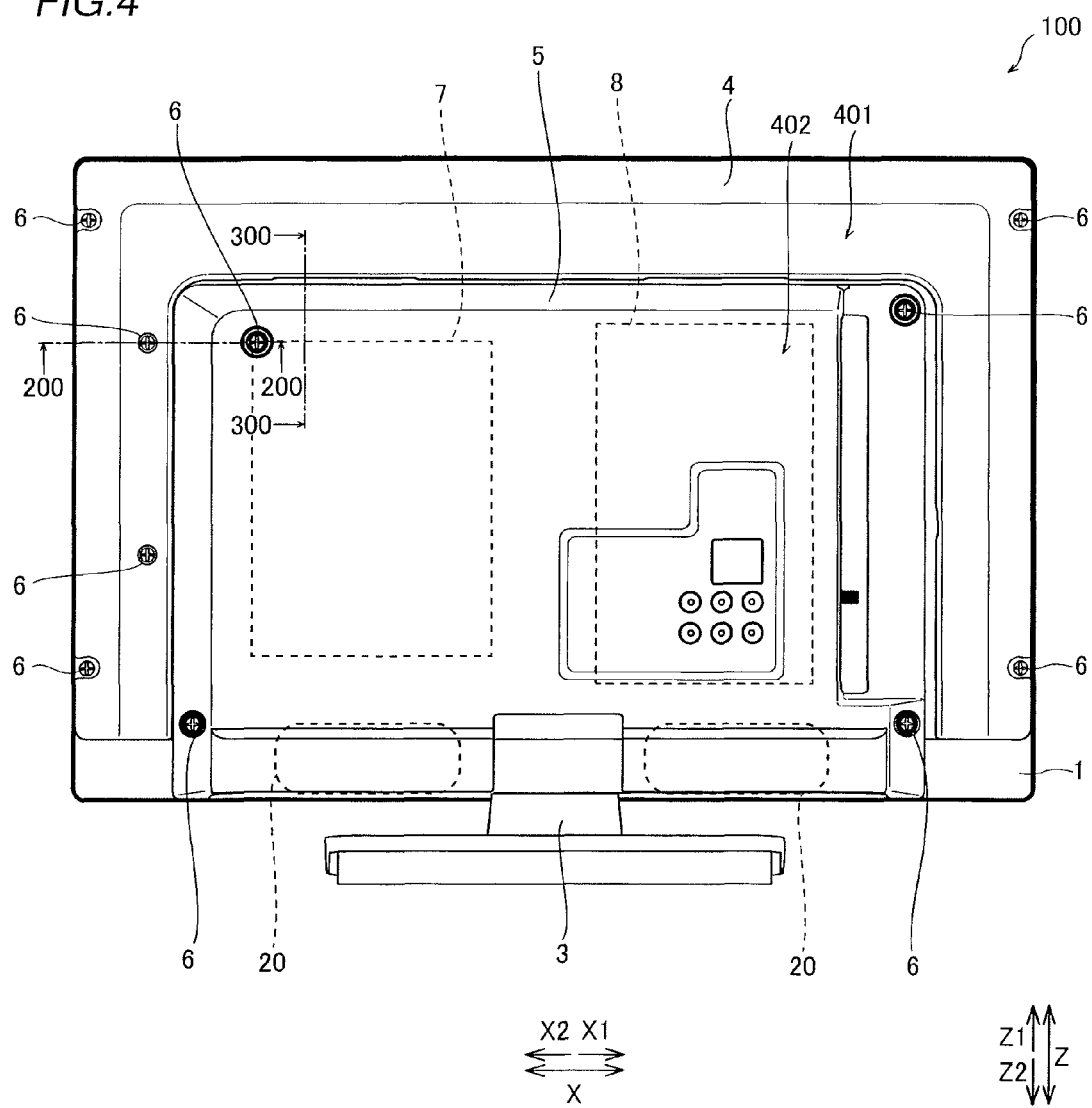
FIG. 4 is a rear elevational view (back elevational view) of the liquid crystal television set according to the embodiment of the present invention.

As shown in FIG. 2, a metal display panel support member (rear frame) 4 made of sheet metal (SECC: electrolytic zinc-plated steel) is arranged at the back (along arrow Y2) of the front housing 1, as shown in FIG. 2. The display panel support member 4 is arranged to support the liquid crystal display panel 2. The display panel support member 4 has a rectangular shape and is formed to be smaller than the front housing 1 as viewed from behind, as shown in FIG. 4.

A cover member 5 made of resin is mounted on the rear surface (back surface) of the metal display panel support member 4. The cover member 5 has a rectangular shape and is formed to be smaller than the front housing 1 and the display panel support member 4 as viewed from behind.

The cover member 5 covers the rear surface of the display panel support member 4 to expose a portion around an outer peripheral portion of the rear surface (back surface) of the display panel support member 4 in an inverted U shape as viewed from behind. The rear surface (back surface) of the display panel support member 4 has a region 401 exposed from the cover member 5 and a region 402 covered with the cover member 5. The region 401 of the display panel support member 4 exposed from the cover member 5 and the cover member 5 constitute a rear housing. In other words, the region 401 partially forming the rear surface (back surface) of the display panel support member 4 constitutes the rear housing.

Figure 3:
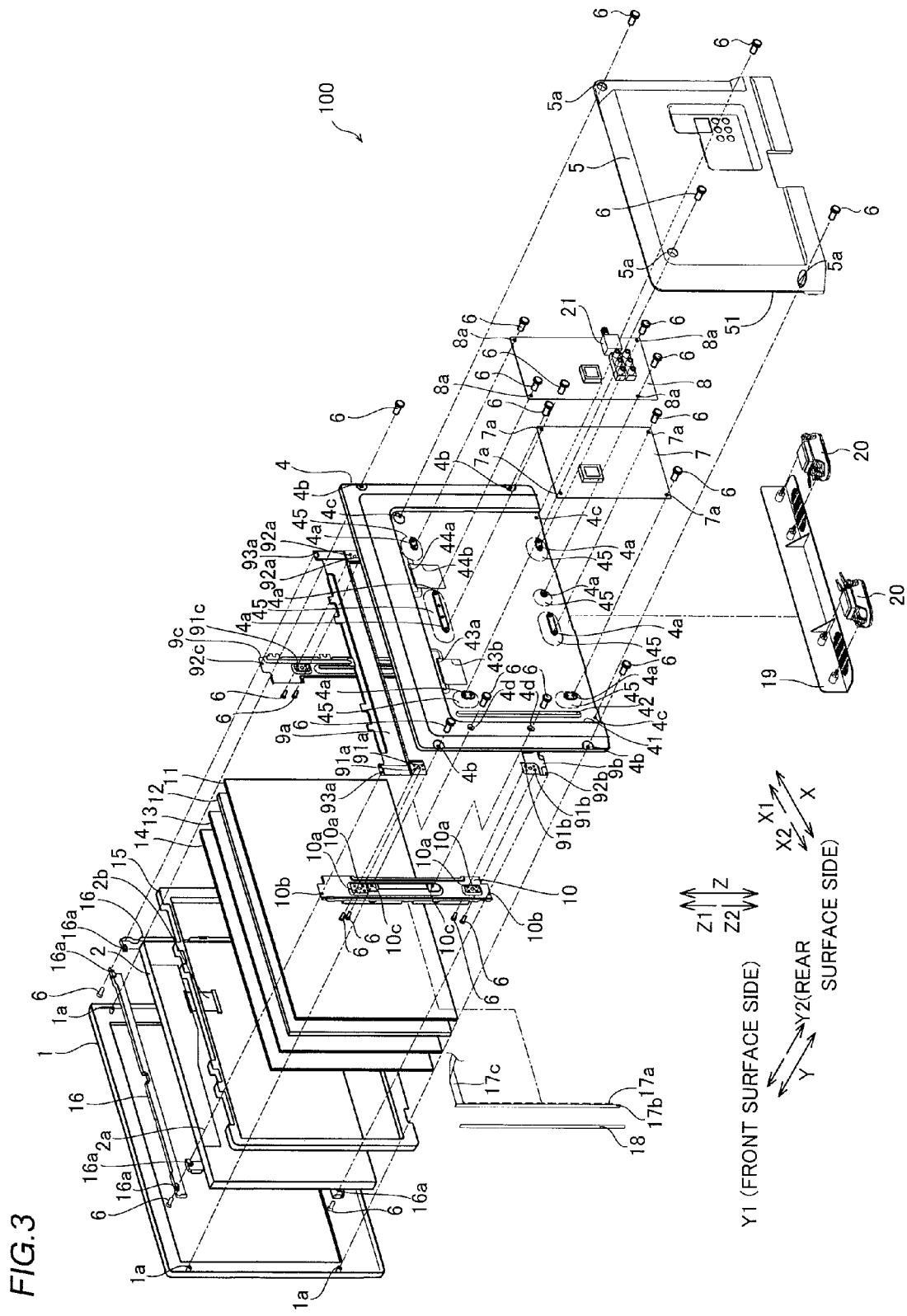
FIG. 3 is an exploded perspective view of the liquid crystal television set according to the embodiment of the present invention.

As shown in FIG. 3, a circuit board 7 having a function of supplying power to the overall liquid crystal television set 100 and a circuit board 8 performing signal processing are mounted on the region 402, covered with the cover member 5, of the rear surface (back surface) of the display panel support member 4 by screws 6 at a prescribed interval in a direction X.

Metal reflection sheet holders 9a, 9b and 9c made of sheet metal (SECC) and a heat sink 10 are arranged in front of the display panel support member 4 (along arrow Y1). A reflection sheet 11 reflecting light received from an LED source 17a described later, a light guide 12 and a light diffusion sheet 13 diffusing the light, a lens sheet 14 collecting the light, a frame-shaped resin frame 15, the liquid crystal display panel 2, four bezels 16 and the front housing 1 are arranged in front of the reflection sheet holders 9a, 9b and 9c and the heat sink 10 (along arrow Y1). The reflection sheet holders 9a, 9b and 9c and the heat sink 10 press four sides of the reflection sheet 11 against the light guide 12.

A liquid crystal display panel driving board 2a driving the liquid crystal display panel 2 is provided on an upper end portion (along arrow Z1) of the liquid crystal display panel 2. A power supply wire 2b connected with the circuit board 8 is connected to the liquid crystal display panel driving board 2a.

Figure 6:
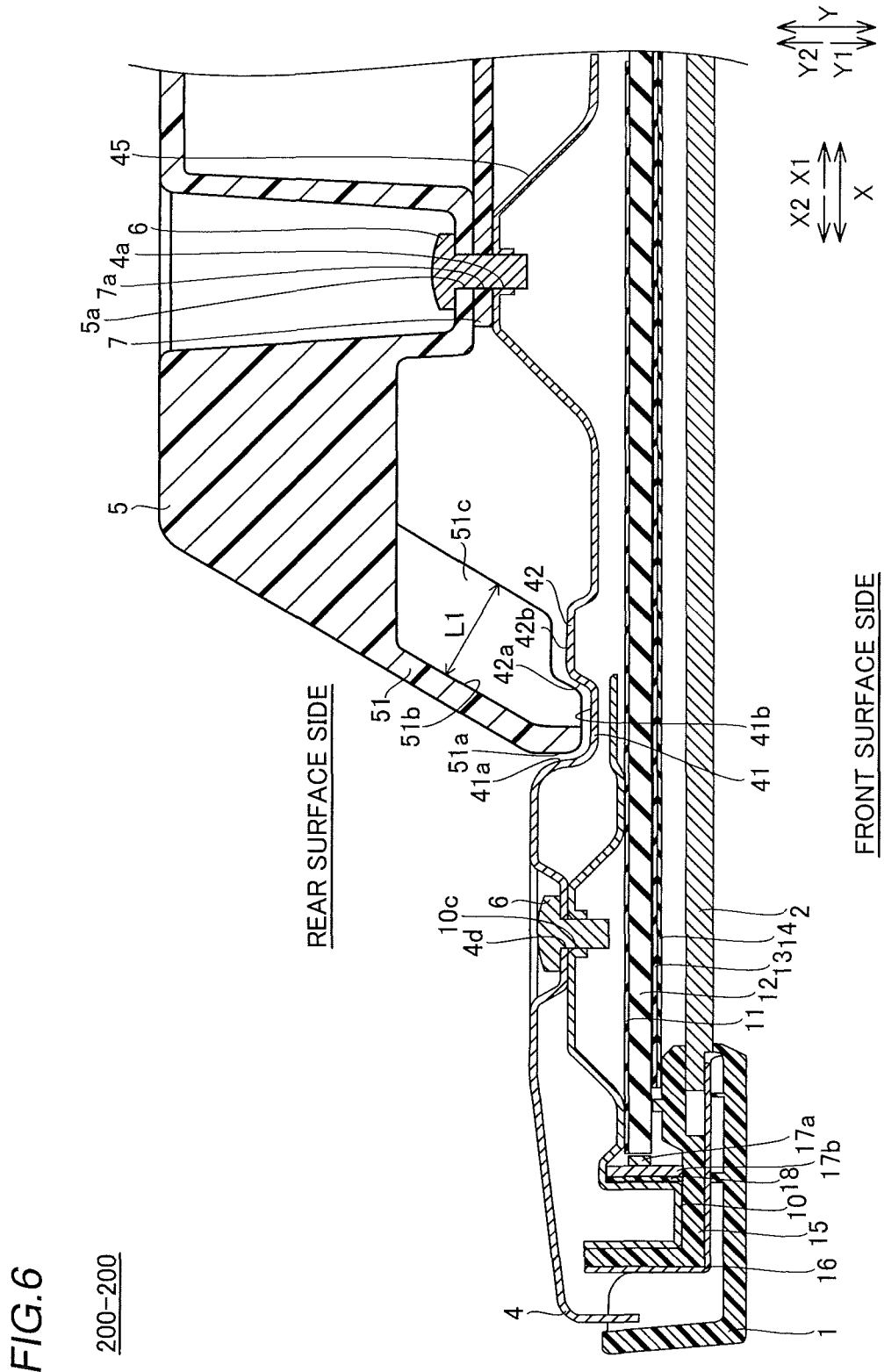
FIG. 6 is a sectional view taken along the line 200-200 in FIG. 4.

The LED source 17a for a backlight constituted of a plurality of LEDs is arranged on a side portion (along arrow X2) of the light guide 12, as shown in FIG. 6. The LED source 17a is mounted on a surface of an LED board 17b along arrow X1. Another surface (opposite to the surface mounted with the LED source 17a) of the LED board 17b along arrow X2 is mounted on a surface of the heat sink 10 along arrow X1 through a heat radiation tape (sheet) 18. An LED wire 17c (see FIG. 3) connected with the circuit board 7 is connected to the LED board 17b.

According to this embodiment, a recess portion 41 regulating outward movement of the cover member 5, a projecting portion 42 regulating inward movement of the cover member 5 and two upright portions 43a and 44a regulating inward movement of the cover member 5 when the cover member 5 is mounted on the display panel support member 4 are formed on the rear surface (back surface) of the display panel support member 4, as shown in FIGS. 5 to 9. The recess portion 41 of the display panel support member 4 is an example of the "first movement regulating portion" in the present invention, the projecting portion 42 is an example of the "second movement regulating portion" in the present invention, and the two upright portions 43a and 44a are examples of the "third movement regulating portion" in the present invention.

Figure 5:
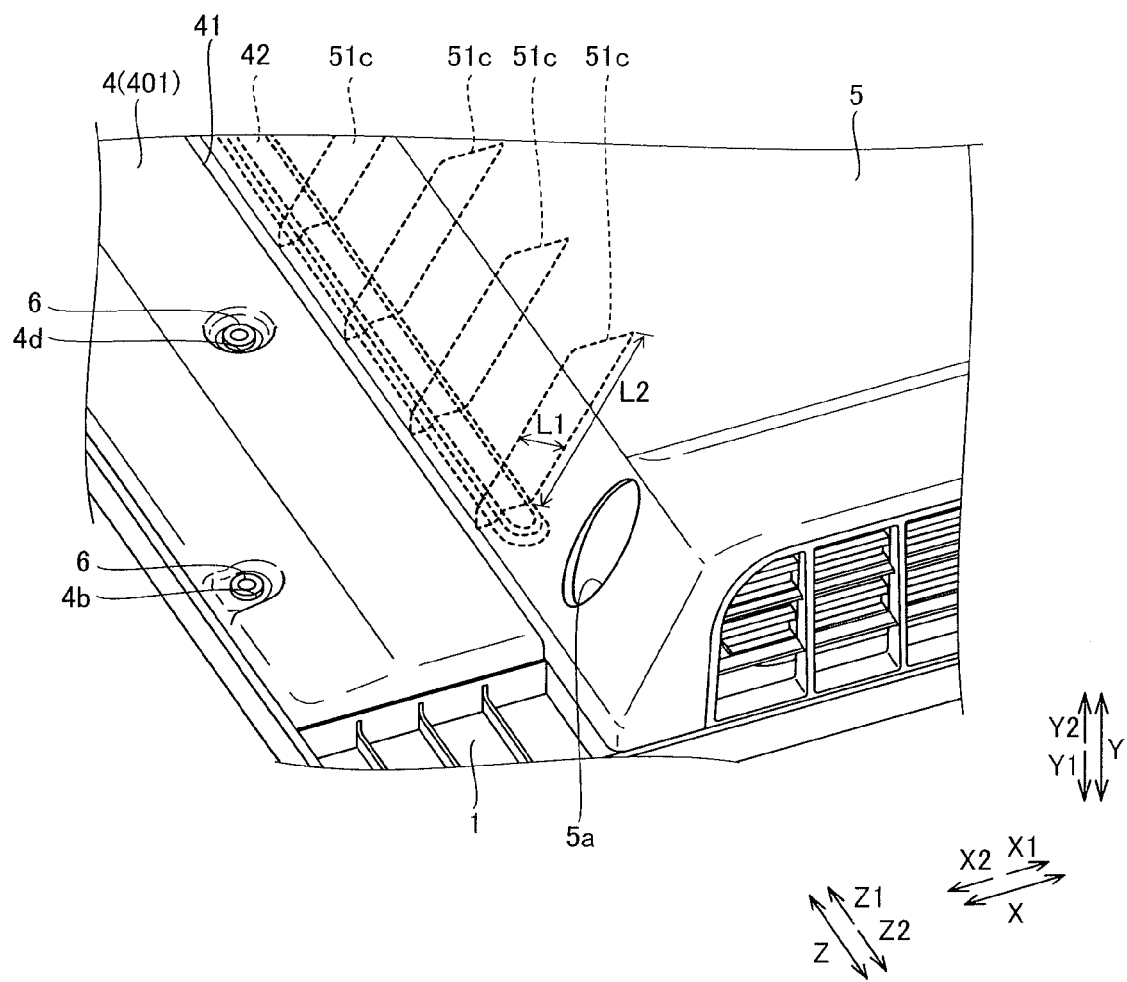
FIG. 5 is a perspective view showing a state where first rib portions of a cover member of the liquid crystal television set according to the embodiment of the present invention are arranged to be opposed to a projecting portion of a display panel support member.

More specifically, the recess portion 41 formed on the rear surface (back surface) of the display panel support member 4 is concaved toward the side (front surface side) (along arrow Y1) of the liquid crystal display panel 2, as shown in FIGS. 5 and 6. Further, the recess portion 41 of the display panel support member 4 is formed by drawing. The region of the display panel support member 4 provided with the recess portion 41 has a rectangular shape as viewed from behind.

Figure 9:
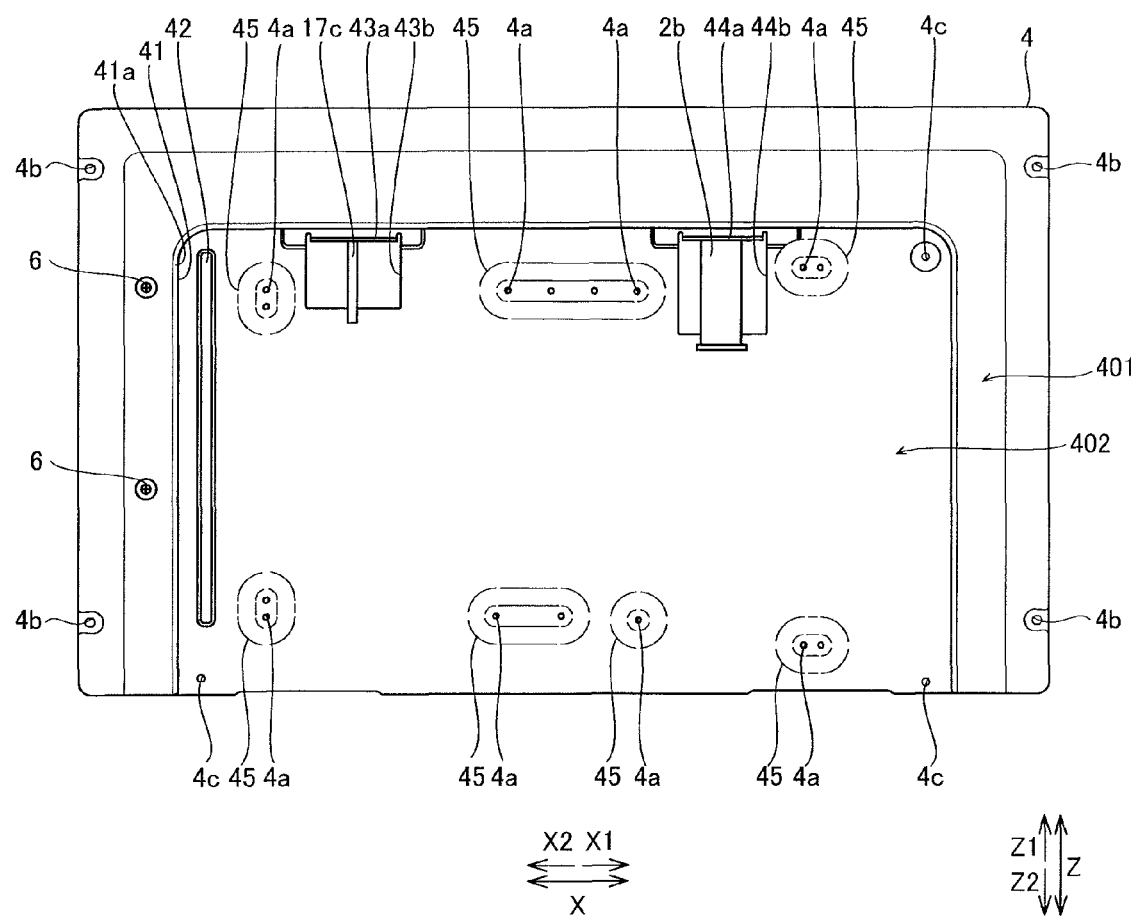
FIG. 9 is a rear elevational view (back elevational view) of the display panel support member of the liquid crystal television set according to the embodiment of the present invention.

As shown in FIG. 9, the recess portion 41 of the display panel support member 4 is formed from an inner region up to a lower region of the rear surface of the display panel support member 4 as viewed from behind. The surface area of the region provided with the recess portion 41 is substantially equal to that of the region 402 of the display panel support member 4 covered with the cover member 5.

Inner side surfaces 41a of the recess portion 41 of the display panel support member 4 extend to exhibit an inverted U shape as viewed from behind. In other words, regions where outer side surfaces 51a (see FIGS. 6 to 8) of an outer edge portion 51 of the cover member 5 and the inner side surfaces 41a of the recess portion 41 of the display panel support member 4 are opposed to each other extend to exhibit an inverted U shape as viewed from behind. More specifically, the inner side surfaces 41a of the recess portion 41 exhibiting the inverted U shape are formed to continuously extend along regions of the display panel support member 4 along arrows X2, Z1 and X1. The liquid crystal television set 100 is so formed that the inner side surfaces 41a formed on regions of the recess portion 41 of the display panel support member 4 in three directions (along arrows X2, Z1 and X1) and the outer side surfaces 51a of the cover member 5 come into contact with each other when the cover member 5 is mounted on the display panel support member 4 thereby regulating movement of the cover member 5 in three outward directions. Thus, the cover member 5 is roughly positioned and station-kept with respect to the display panel support member 4.

In a state where the cover member 5 is fixed to the display panel support member 4, the outer side surfaces 51a of the outer edge portion 51 of the cover member 5 are opposed to the inner side surfaces 41a of the recess portion 41 of the display panel support member 4 at a prescribed interval (with a prescribed clearance), as shown in FIG. 6. The clearance is so provided between the cover member 5 (outer side surfaces 51a) and the display panel support member 4 (inner side surfaces 41a) that noise (chattering noise) resulting from sounds or the like generated from speakers 20 described later can be reduced.

According to this embodiment, the projecting portion 42 of the display panel support member 4 is formed on a left end region (along arrow X2) of the recess portion 41 of the display panel support member 4 and arranged on a region inward (along arrow X1) beyond the inner side surfaces 41a of the recess portion 41 as viewed from behind, as shown in FIG. 9. Further, the projecting portion 42 of the display panel support member 4 is formed to extend in a direction Z along one inner side surface 41a of the recess portion 41 of the display panel support member 4 as viewed from behind. In other words, the projecting portion 42 of the display panel support member 4 is formed in the vicinity of one side (extending in the direction Z along arrow X2) constituting an outer peripheral portion of the rectangular region of the display panel support member 4 provided with the recess portion 41, to extend along this side (along the direction Z).

As shown in FIG. 6, the projecting portion 42 of the display panel support member 4 is formed to protrude toward the side (rear surface side) (along arrow Y2) of the cover member 5. Further, the projecting portion 42 of the display panel support member 4 is formed by drawing.

In the state where the cover member 5 is fixed to the display panel support member 4 by the screws 6, inner side surfaces 51b of the cover member 5 are opposed to outer side surfaces 42a of the projecting portion 42 of the display panel support member 4 at a prescribed interval (with a prescribed clearance). The outer edge portion 51 of the cover member 5 is arranged between the outer side surfaces 42a of the projecting portion 42 and the inner side surfaces 41a of the recess portion 41.

The cover member 5 has first rib portions 51c integrally formed thereon to extend inward from the inner side surfaces 51b. In the state where the cover member 5 is fixed to the display panel support member 4 by the screws 6, the first rib portions 51c of the cover member 5 are arranged to be opposed to a bottom surface 41b of the recess portion 41 of the display panel support member 4 as well as the outer side surfaces 42a and a surface 42b of the projecting portion 42 at prescribed intervals (with prescribed clearances) respectively. In other words, portions of the first rib portions 51c of the cover member 5 opposed to the projecting portion 42 have concave shapes corresponding to the convex shape of the projecting portion 42.

The liquid crystal television set 100 is so formed that the outer side surfaces 42a of the projecting portion 42 of the display panel support member 4 and the first rib portions 51c of the cover member 5 opposed to the projecting portion 42 of the display panel support member 4 come into contact with each other when the cover member 5 is mounted on the display panel support member 4 thereby regulating inward movement of the cover member 5 (in a direction along a central portion from the outer edge portion 51 of the cover member 5). Thus, the cover member 5 is roughly positioned and station-kept with respect to the display panel support member 4.

The first rib portions 51c of the cover member 5 are plurally formed at intervals along the extensional direction (direction Z) of the projecting portion 42 of the display panel support member 4, as shown in FIG. 5. Each first rib portion 51c of the cover member 5 is so formed that a length L2 in a direction along the corresponding inner side surface 51b of the cover member 5 is larger than a length L1 in a direction perpendicular to the corresponding inner side surface 51b of the cover member 5.

According to this embodiment, the two upright portions 43a and 44a of the display panel support member 4 are formed on two portions of an upper end region (along arrow Z1) of the recess portion 41 of the display panel support member 4 along the direction X as viewed from behind, as shown in FIG. 9. Further, the upright portions 43a and 44a are formed to extend in the direction X along the corresponding inner side surfaces 41a of the recess portion 41 of the display panel support member 4. Thus, the projecting portion 42 of the display panel support member 4 and the upright portions 43a and 44a are formed along two sides (a side extending in the direction Z along arrow X2 and a side extending in the direction X along arrow Z1) constituting the outer peripheral portion of the rectangular region of the display panel support member 4 provided with the recess portion 41 and intersecting with each other.

The upright portions 43a and 44a of the display panel support member 4 are arranged on a region inward (along arrow Z2) beyond the upper inner side surface 41a of the recess portion 41 as viewed from behind. Further, the upright portions 43a and 44a are formed by uprighting part (inward beyond the upper inner side surface 41a of the recess portion 41) of the rear surface (back surface) of the display panel support member 4 toward the side (along arrows Y2 and Z1) of the cover member 5.

The upright portion 43a is formed by uprighting a portion of the display panel support member 4 corresponding to a hole portion 43b for passing the LED wire 17c connected to the circuit board 7 (see FIG. 3) therethrough when the hole portion 34b is formed. The upright portion 44a is formed by uprighting a portion of the display panel support member 4 corresponding to a hole portion 44b for passing the power supply wire 2b connected to the circuit board 8 therethrough when the hole portion 44b is formed. The hole portions 43b and 44b have substantially rectangular shapes as viewed from behind. The upright portion 43a (44a) is formed on an upper end region (along arrow Z1) of the hole portion 43b (44b) as viewed from behind.

Figure 7:
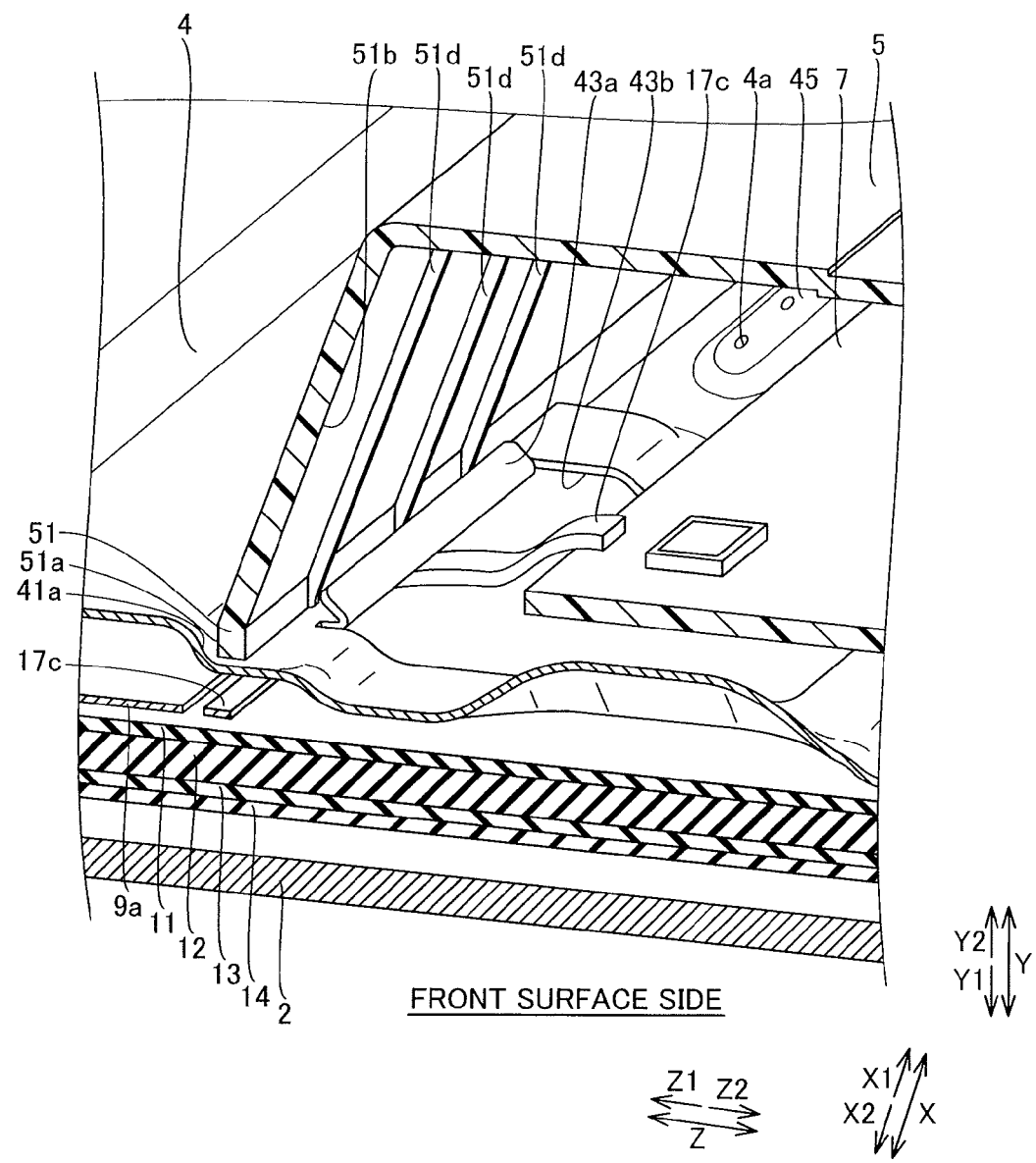
FIG. 7 is a perspective sectional view taken along the line 300-300 in FIG. 4.
Figure 8:
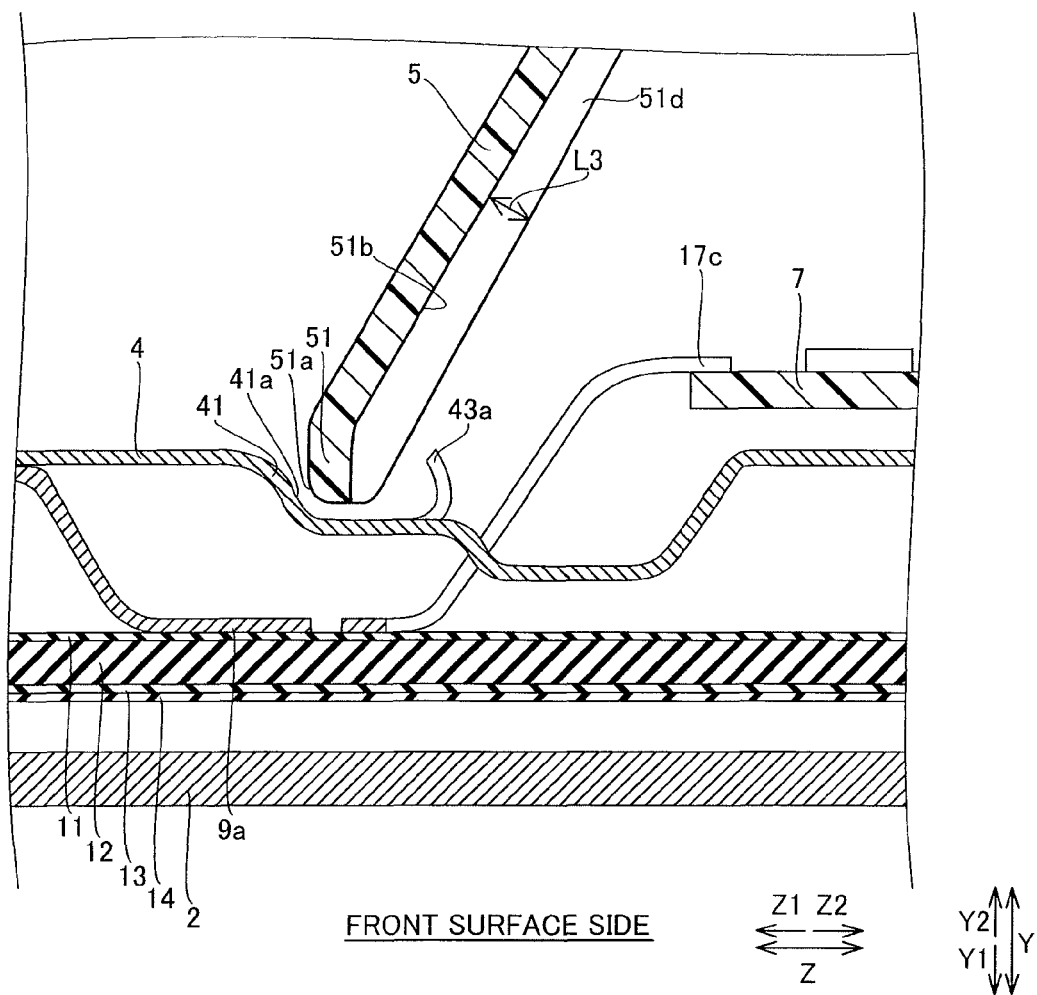
FIG. 8 is a sectional view taken along the line 300-300 in FIG. 4.

As shown in FIGS. 7 and 8, the cover member 5 has second rib portions 51d integrally formed thereon to extend inward (along arrow Z2) from the inner side surfaces 51b of the cover member 5. A length L3 (see FIG. 8) of each second rib portion 51d of the cover member 5 in the direction perpendicular to the corresponding inner side surface 51b is larger than the length L1 of each first rib portion 51c of the cover member 5 in the direction perpendicular to the corresponding inner side surface 51b.

In the state where the cover member 5 is fixed to the display panel support member 4 by the screws 6, the second ribs 51*d* of the cover member 5 are arranged at prescribed intervals (with prescribed clearances) to be opposed to the respective ones of the upright portions 43*a* and 44*a* of the display panel support member 4. The liquid crystal television set 100 is so formed that the second rib portions 51*d* of the cover member 5 and the respective ones of the upright portions 43*a* and 44*a* of the display panel support member 4 come into contact with each other when the cover member 5 is mounted on the display panel support member 4 thereby regulating inward movement of the cover member 5. Thus, the cover member 5 is roughly positioned and station-kept with respect to the display panel support member 4.

In the state where the cover member 5 is fixed to the display panel support member 4 by the screws 6, the inner side surfaces 51*b* of the cover member 5 are opposed to an end portion, closer to the cover member 5, of the display panel support member 4 provided with the upright portion 43*a* (44*a*) at a prescribed interval (with a prescribed clearance), as shown in FIG. 7. The outer edge portion 51 of the cover member 5 is arranged between the end portion, closer to the cover member 5, of the display panel support member 4 provided with the upright portion 43*a* (44*a*) and the inner side surfaces 41*a* of the recess portion 41.

A plurality of board mounting portions 45 for mounting the respective ones of the circuit boards 7 and 8 are formed on the rear surface (bottom surface) of the display panel support member 4, as shown in FIG. 9. The plurality of board mounting portions 45 are formed to protrude toward the cover member 5. Further, the plurality of board mounting portions 45 are provided with board mounting threaded holes 4*a*.

A plurality of screw receiving holes 7*a* for receiving a plurality of screws 6 are formed on an outer edge portion of the circuit board 7, as shown in FIG. 3. The plurality of screws 6 are mounted on the plurality of board mounting threaded holes 4*a* of the display panel support member 4 through the screw receiving holes 7*a* of the circuit board 7, thereby fixing the circuit board 7 to the display panel support member 4.

A plurality of screw receiving holes 8*a* for receiving a plurality of screws 6 are formed on an outer edge portion of the circuit board 8. The plurality of screws 6 are mounted on the plurality of board mounting threaded holes 4*a* of the display panel support member 4 through the screw receiving holes 8*a* of the circuit board 8, thereby fixing the circuit board 8 to the display panel support member 4.

A plurality of cover member mounting threaded holes 4*c* for mounting the cover member 5 are formed on the rear surface of the display panel support member 4. A plurality of screw receiving holes 5*a* are formed in the vicinity of the outer edge portion 51 of the cover member 5. A plurality of screws 6 are mounted on the cover member mounting threaded holes 4*c* of the display panel support member 4 through the plurality of screw receiving holes 5*a* of the cover member 5, thereby fixing the cover member 5 to the display panel support member 4. The screw 6 mounted on the upper left screw receiving hole 5*a* of the cover member 5 is mounted on the upper left board mounting threaded hole 4*a* of the display panel support member 4 through the upper left screw receiving hole 7*a* of the circuit board 7, as shown in FIGS. 3 and 6. In other words, the front surface (along arrow Y1) of the cover member 5 is mounted to indirectly come into contact with the rear surfaces (back surfaces) (along arrow Y2) of the board mounting portions 45 of the display panel support member 4 through the circuit board 7.

Two speakers 20 are mounted on a speaker mounting member 19, as shown in FIG. 3. The cover member 5 is mounted on the cover member mounting threaded holes 4*c* formed on the lower end of the display panel support member 4 with screws 6, to hold the speaker mounting member 19 therebetween. The cover member 5 is mounted to cover the circuit boards 7 and 8 and the speaker mounting member 19 mounted with the two speakers 20 from behind.

A plurality of screw receiving holes 4*b* for fixing the display panel support member 4 to the front housing 1 are formed on the display panel support member 4 along the outer edge portion thereof. A plurality of support member mounting threaded holes 1*a* are formed on the rear surface of the front housing 1 along the outer edge portion thereof. A plurality of screws 6 are mounted on the plurality of support member mounting threaded holes 1*a* of the front housing 1 through the screw receiving holes 4*b* of the display panel support member 4, thereby fixing the display panel support member 4 to the front housing 1.

Two support member mounting threaded holes 10*c* for fixing the heat sink 10 to the display panel support member 4 are formed on the rear surface (back surface) of the heat sink 10. The display panel support member 4 is provided with screw receiving holes 4*d* to be mounted with screws 6. The screws 6 are mounted on the support member mounting threaded holes 10*c* of the heat sink 10 through the screw receiving holes 4*d* of the display panel support member 4, thereby fixing the heat sink 10 and the display panel support member 4 to each other.

The heat sink 10 is provided with screw receiving holes 10*a* for mounting the reflection sheet holders 9*a* and 9*b*. Heat sink mounting threaded holes 91*a* and 91*b* for mounting the heat sink 10 are formed on left ends of the reflection sheet holders 9*a* and 9*b* respectively. Screws 6 are mounted on the heat sink mounting threaded holes 91*a* and 91*b* of the reflection sheet holders 9*a* and 9*b* through the screw receiving holes 10*a* of the heat sink 10, thereby fixing the heat sink 10 and the reflection sheet holders 9*a* and 9*b* to each other.

The reflection sheet holder 9*c* is provided with screw receiving holes 91*c* for mounting the reflection sheet holders 9*a* and 9*b*. A reflection sheet holder mounting threaded hole 92*a* for mounting the reflection sheet holder 9*c* is formed on a right end of the reflection sheet holder 9*a*. A reflection sheet holder mounting threaded hole (not shown) for mounting the reflection sheet holder 9*c* is formed on a right end of the reflection sheet holder 9*c*. Screws 6 are mounted on the reflection sheet holder mounting threaded hole 92*a* of the reflection sheet holder 9*a* and the reflection sheet holder mounting threaded holder (not shown) of the reflection sheet holder 9*b* through the screw receiving holes 91*c* of the reflection sheet holder 9*c*, thereby fixing the reflection sheet holders 9*a* and 9*b* and the reflection sheet holder 9*c* to each other.

Screw receiving holes 10*b* for fixing the heat sink 10 and the bezels 16 to each other are formed on upper and lower end portions of the heat sink 10 respectively. Bezel mounting threaded holes 93*a* for mounting the bezels 16 are formed on the right and left ends of the reflection sheet holder 9*a* respectively, while bezel mounting threaded holes 92*b* for mounting the bezels 16 are formed on the right and left ends of the reflection sheet holder 9*b* respectively. Screw receiving holes 16*a* for mounting screws 6 are formed on the bezels 16. The screws 6 are mounted on the bezel mounting threaded holes 93*a* and 93*b* formed on the left ends of the reflection sheet holders 9*a* and 9*b* respectively through the screw receiving holes 16*a* of the bezels 16 and the screw receiving holes 10*b* of the heat sink 10, thereby fixing the bezels 16, the heat sink 10 and the reflection sheet holders 9*a* and 9*b* to each other.

Screw receiving holes 92c for mounting the bezels 16 are formed on upper and lower end portions of the reflection sheet holder 9c respectively. Screws 6 are mounted on the bezel mounting threaded hole 93a formed on the right end of the reflection sheet holder 9a through the screw receiving holes 16a of the bezels 16 and the screw receiving hole 92c on the upper end portion of the reflection sheet holder 9c and mounted on a bezel mounting threaded hole (not shown) formed on the right end of the reflection sheet holder 9b through the screw receiving holes 16a of the bezels 16 and a bezel mounting threaded hole (not shown) formed on the right end of the reflection sheet holder 9b, thereby fixing the bezels 16 and the reflection sheet holders 9a, 9b and 9c to each other.

Figure 10:
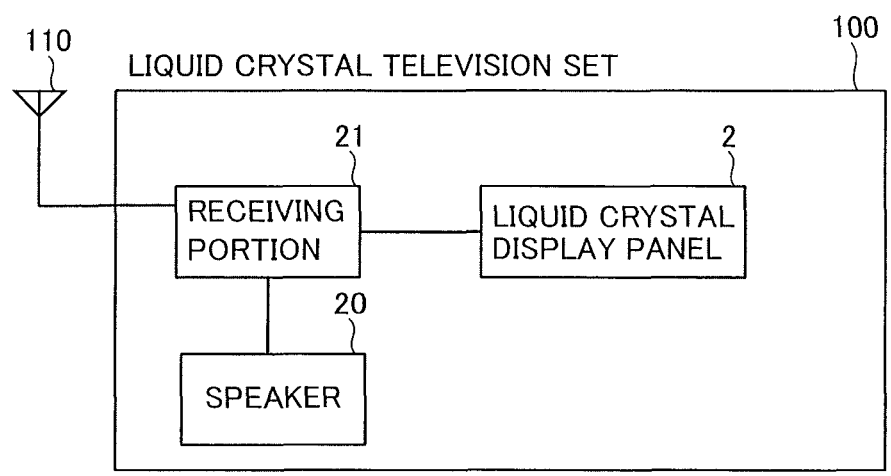
FIG. 10 is a block diagram of the liquid crystal television set according to the embodiment of the present invention.

As shown in FIG. 10, the circuit board 8 (see FIG. 3) for signal processing mounted on the display panel support member 4 has a receiving portion (tuner) 21 (see FIG. 3) capable of receiving television broadcasting. In the liquid crystal television set 100, the receiving portion 21 is connected with the liquid crystal display panel 2 and the speakers 20 as shown in FIG. 10, and formed to output a picture signal and a sound signal in television broadcasting signals (the picture signal and the sound signal) received by an antenna 110 to the liquid crystal display panel 2 and the speakers 20 respectively.

According to this embodiment, as hereinabove described, the recess portion 41 (the projecting portion 42 and the upright portions 43a and 44a) regulating movement of the cover member 5 when mounted on the display panel support member 4 is provided on the rear surface of the display panel support member 4 so that the recess portion 41 (the projecting portion 42 and the upright portions 43a and 44a) regulates movement of the cover member 5, whereby the cover member 5 can be roughly positioned and station-kept when mounted on the display panel support member 4. Thus, mounting workability can be improved when mounting the cover member 5 on the display panel support member 4. Further, the recess portion 41 (the projecting portion 42 and the upright portions 43a and 44a) regulating movement of the cover member 5 is so provided on the display panel support member 4 that the recess portion 41 (the projecting portion 42 and the upright portions 43a and 44a) can reliably regulate inward or outward movement of the outer edge portion 51 of the cover member 5 when external force is applied to the cover member 5 in the state where the cover member 5 is fixed to the display panel support member 4 by the screws 6.

According to this embodiment, as hereinabove described, the liquid crystal television set 100 is so formed that the inner side surfaces 41a of the recess portion 41 of the display panel support member 4 regulate outward movement of the cover member 5 when the cover member 5 is mounted on the display panel support member 4. Thus, the cover member 5 can be easily roughly positioned and station-kept outward by the inner side surfaces 41a of the recess portion 41, whereby the mounting workability for the cover member 5 can be easily improved.

According to this embodiment, as hereinabove described, the regions where the side surfaces 51a of the cover member 5 and the inner side surfaces 41a of the recess portion 41 of the display panel support member 4 are opposed to each other are formed to extend with the inverted U shape as viewed from behind when the cover member 5 is mounted on the display panel support member 4. Thus, the cover member 5 can be easily roughly positioned and station-kept with respect to three directions by the three inner side surfaces 41a (three sides) of the recess portion 41 having the inverted U shape, whereby the mounting workability for the cover member 5 can be further improved.

According to this embodiment, as hereinabove described, the liquid crystal television set 100 is formed to regulate inward movement of the cover member 5 by the outer side surfaces 42a of the projecting portion 42 of the display panel support member 4 when the cover member 5 is mounted on the display panel support member 4. Thus, the cover member 5 can be roughly positioned and station-kept inward by the outer side surfaces 42a of the projecting portion 42, whereby the mounting workability can be improved also by this when mounting the cover member 5 on the display panel support member 4.

According to this embodiment, as hereinabove described, the outer edge portion 51 of the cover member 5 is arranged between the outer side surfaces 42a of the projecting portion 42 and the inner side surfaces 41a of the recess portion 41. Thus, the cover member 5 can be roughly positioned and station-kept outward and inward by the recess portion 41 (first movement regulating portion) and the projecting portion 42 (second movement regulating portion) respectively, whereby the mounting workability can be further improved when mounting the cover member 5 on the display panel support member 4.

According to this embodiment, as hereinabove described, the projecting portion 42 of the display panel support member 42 is formed in the vicinity of one side (extending in the direction Z along arrow X2) constituting the outer peripheral portion of the rectangular region of the display panel support member 4 provided with the recess portion 41, to extend along this side (along the direction Z). Thus, the cover member 5 can be effectively roughly positioned and station-kept inward by the outer side surfaces 42a of the projecting portion 24 extending along one side extending in the direction Z along arrow X2.

According to this embodiment, as hereinabove described, the liquid crystal television set 100 is formed to regulate inward movement of the cover member 5 by the first rib portions 51c of the cover member 5 opposed to the projecting portion 42 of the display panel support member 4 when the cover member 5 is mounted on the display panel support member 4. Thus, the mounting workability for the cover member 5 can be improved by roughly positioning and station-keeping the cover member 5 inward by the first rib portions 51c of the cover member 5 while suppressing increase in number of components, dissimilarly to a case where the first rib portions 51c are provided separately from the cover member 5.

According to this embodiment, as hereinabove described, the first rib portions 51c of the cover member 5 are plurally formed at the intervals along the extensional direction (direction Z) of the projecting portion 42 of the display panel support member 4. Thus, the cover member 5 can be effectively roughly positioned and station-kept inward by the first rib portions 51 plurally formed at the intervals along the extensional direction of the projecting portion 42, whereby the mounting workability for the cover member 5 can be further improved.

According to this embodiment, as hereinabove described, the liquid crystal television set 100 is formed to regulate inward movement of the cover member 5 by the upright portion 43a (44a) of the display panel support member 4 when the cover member 5 is mounted on the display panel support member 4. Thus, the cover member 5 can be easily roughly positioned and station-kept inward by the upright portion 43a (44a) of the display panel support member 4.

According to this embodiment, as hereinabove described, the upright portion 43a (44a) on the rear surface of the display panel support member 4 is formed by uprighting the portion corresponding to the hole portion 43b (44b) for passing the LED wire 17c (power supply wire 2b) therethrough when forming the hole portion 43b (44b). Thus, manufacturing steps for the liquid crystal television set 100 can be simplified, dissimilarly to a case of forming the upright portion 43a (44a) and the hole portion 43b (44b) for passing the LED wire 17c (power supply wire 2b) therethrough separately from each other.

According to this embodiment, as hereinabove described, the upright portion 43a (44a) is formed by uprighting the portion of the rear surface of the display panel support member 4 inward beyond the upper inner side surface 41a of the recess portion 41 toward the side (along arrows Y2 and Z1) of the cover member 5 and the outer edge portion 51 of the cover member 5 is arranged between the end portion, closer to the cover member 5, provided with the upright portion 43a (44a) and the upper inner side surface 41a of the recess portion 41. Thus, the cover member 5 can be roughly positioned and station-kept outward and inward by the recess portion 41 and the upright portion 43a (44a) respectively, whereby the mounting workability can be further improved when mounting the cover member 5 on the display panel support member 4.

According to this embodiment, the projecting portion 42 and the upright portion 43a (44a) of the display panel support member 4 are formed along the two sides (the side extending in the direction Z along arrow X2 and the side extending in the direction X along arrow Z1) constituting the outer peripheral portion of the rectangular region of the display panel support member 4 provided with the recess portion 41 and intersecting with each other. Thus, the cover member 5 can be more effectively roughly positioned and station-kept inward by the projecting portion 42 and the upright portion 43a (44a) formed along the two sides intersecting with each other respectively.

According to this embodiment, as hereinabove described, the display panel support member 4 is provided with the two upright portions 43a and 44a. Thus, the cover member 5 can be more effectively roughly positioned and station-kept inward by the two upright portions 43a and 44a.

According to this embodiment, as hereinabove described, the liquid crystal television set 100 is formed to regulate inward movement of the cover member 5 by the second rib portions 51d of the cover member 5 opposed to the upright portion 43a (44a) of the display panel support member 4 when the cover member 5 is mounted on the display panel support member 4. Thus, the cover member 5 can be roughly positioned and station-kept inward by the second rib portions 51d of the cover member 5 while suppressing increase in number of components, dissimilarly to a case where the second rib portions 51d are provided separately from the cover member 5.

Although the present invention has been described and illustrated in detail, it is clearly understood that the same is by way of illustration and example only and is not to be taken by way of limitation, the spirit and scope of the present invention being limited only by the terms of the appended claims.

For example, while the present invention is applied to the liquid crystal television set as the example of the display (television) set according to the present invention in the aforementioned embodiment, the present invention is not restricted to this. The present invention is also applicable to another display such as a monitor of a personal computer other than the television set, or a television set other than the liquid crystal television set, for example.

While the projecting portion, the recess portion and the upright portions are provided on the rear surface (back surface) of the display panel support member as examples of the movement regulating portion in the present invention for roughly positioning the cover member in the aforementioned embodiment, the present invention is not restricted to this. For example, a movement regulating portion other than the projecting portion, the recess portion and the upright portions may alternatively be provided on the rear surface (back surface) of the display panel support member, so far as the same can regulate movement of the cover member when the cover member is mounted on the display panel support member.

While the recess portion (first movement regulating portion) is provided from the inner region up to the lower region of the display panel support member as viewed from behind while the regions where the outer side surfaces of the cover member and the inner side surfaces of the recess portion of the display panel support member are opposed to each other extend to exhibit the inverted U shape as viewed from behind in the aforementioned embodiment, the present invention is not restricted to this. For example, the recess portion (first movement regulating portion) may alternatively be formed on the rear surface (back surface) of the display panel support member to have a substantially rectangular shape as viewed from behind. In this case, four outer side surfaces (four sides) of the cover member are arranged to be opposed to four inner side surfaces (four sides) of the recess portion, whereby movement of the cover member in four directions can be regulated when the cover member is mounted on the display panel support member.

While the projecting portion (second movement regulating portion) is formed on the left end region (along arrow X2) of the recess portion of the display panel support member as viewed from behind in the aforementioned embodiment, the present invention is not restricted to this. For example, the projecting portion (second movement regulating portion) may alternatively be formed on an upper end region (along arrow Z1), a right end region (along arrow X1) or a lower end region (along arrow Z2) of the recess portion of the display panel support member.

While the two upright portions (third movement regulating portion) are formed on the rear surface (back surface) of the display panel support member in the aforementioned embodiment, the present invention is not restricted to this. For example, one or at least three upright portions (third movement regulating portion) may alternatively be formed on the rear surface (back surface) of the display panel support member.

While the recess portion, the projecting portion and the upright portions are formed on the rear surface of the metal display panel support member in the aforementioned embodiment, the present invention is not restricted to this. For example, the recess portion and the projecting portion may alternatively be formed on a rear surface of a resin display panel support member.

While the prescribed intervals (clearances) are provided between the outer edge portion of the cover member and the recess portion, the projecting portion and the upright portions of the display panel support member in the aforementioned embodiment, the present invention is not restricted to this. For example, the liquid crystal television set may alternatively be so formed that the outer edge portion of the cover member and the recess portion, the projecting portion and the upright portions of the display panel support member are directly in contact with each other without providing the clearances between the outer edge portion of the cover member and the recess portion, the projecting portion and the upright portions of the display panel support member.

What is claimed is:

1. A display comprising:
   a support member;
   a display panel arranged at a side of a first surface of said support member;
   a depression formed in a part of a second surface of said support member different from said first surface;
   a cover member arranged and opposing to said depression; and
   a first projection portion, wherein
      said depression has a pair of first side surfaces opposing to each other and a second side surface intersecting with said pair of first side surfaces,
      said first projection portion is formed within said depression and extends along said pair of first side surfaces, and
      an outer edge portion of said cover member is accommodated in said depression along said pair of first side surfaces and said second side surface.

2. The display according to claim 1, wherein said outer edge portion of said cover member includes a pair of first outer side surfaces formed along said pair of first side surfaces and a second outer side surface formed along said second side surface.

3. The display according to claim 2, wherein said first side surfaces come into contact with said first outer side surfaces.

4. The display according to claim 2, wherein said second side surface comes into contact with said second outer side surface.

5. The display according to claim 1, wherein said pair of first side surfaces extend along a short-side direction of said display panel, and said second side surface extends along a longitudinal direction of said display panel.

6. The display according to claim 1, wherein said pair of first side surfaces and said second side surface intersect substantially perpendicularly.

7. The display according to claim 6, wherein a portion where said pair of first side surfaces and said second side surface intersect is formed in a round shape.

8. The display according to claim 7, wherein a portion of said cover member which corresponds to said portion where said pair of first side surfaces and said second side surface intersect is formed in a round shape.

9. The display according to claim 6, further comprising: a speaker mounting member that supports a speaker, wherein one end of said pair of first side surfaces intersect with said second side surface, and said speaker mounting member is arranged on said support member in the vicinity of the other end of said pair of first side surfaces.

10. The display according to claim 1, wherein said cover member includes a first rib portion arranged to be opposed to said first projection portion and integrally formed on said cover member.

11. The display according to claim 1, further comprising: a circuit board arranged within said depression.

12. The display according to claim 11, further comprising: a second projection portion formed within said depression, wherein said circuit board is arranged on said second projection portion.

13. The display according to claim 1, further comprising: a fixing portion fixing said cover member to said support member wherein said fixing portion is arranged in the vicinity of said pair of first side surfaces or said second side surface.

14. The display according to claim 1, wherein said support member is made of metal, and said cover member is made of resin.

15. The display according to claim 1, wherein said first side surfaces and said second side surface extend linearly.

16. A display comprising:
    a support member having a first surface and a second surface;
    a display panel arranged closer to said first surface of said support member than to said second surface of said support member;
    a cover member arranged closer to the said second surface of said support member than to said first surface of said support member;
    a depression formed in a part of said second surface of said support member, and
    a first projection portion, wherein
       said depression is formed by: i) a second side surface that extends along a first direction corresponding to a longitudinal axis of the display panel, and ii) a pair of first side surfaces that are arranged opposite to each other and that extend along a second direction away from the display panel,
       said first projection portion is formed within said depression and extends along said pair first side surfaces, and
       an outer edge portion of said cover member extends into said depression.

17. A display comprising:
    a display panel support member arranged at the back of a display panel to support said display panel so that part of a rear surface constitutes a rear housing; and
    a cover member mounted on said display panel support member to cover said part of said rear surface constituting said rear housing, wherein
       a movement regulating portion regulating movement of said cover member is provided on said part of said rear surface,
       said movement regulating portion includes a first movement regulating portion consisting of a recess portion concaved toward said display panel,
       the display is so formed that an inner side surface of said recess portion regulates outward movement of said cover member,
       said recess portion is provided from an inner region up to a lower region of said display panel support member as viewed from behind,
       said inner side surface of said recess portion extends to have an inverted U shape as viewed from behind, and
       a region where an outer side surface of said cover member and said inner side surface of said recess portion are opposed to each other extends to have an inverted U shape as viewed from behind.

* * * * *